(12) United States Patent
Chen et al.

(10) Patent No.: US 8,569,791 B2
(45) Date of Patent: Oct. 29, 2013

(54) LED AND METHOD FOR MANUFACTURING THE SAME

(75) Inventors: Pin-Chuan Chen, Hsinchu (TW); Hsin-Chiang Lin, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/330,704

(22) Filed: Dec. 20, 2011

(65) Prior Publication Data
US 2013/0001629 A1      Jan. 3, 2013

(30) Foreign Application Priority Data
Jun. 30, 2011   (CN) .......................... 2011 1 0181764

(51) Int. Cl.
*H01L 33/00* (2010.01)

(52) U.S. Cl.
USPC ................................ 257/100; 257/99; 257/97

(58) Field of Classification Search
CPC ......... H01L 33/44; H01L 33/46; H01L 33/48; H01L 33/54; H01L 33/58; H01L 33/60
USPC ..................... 257/99, 83, 91, 97, 100; 438/26
See application file for complete search history.

(56) References Cited

U.S. PATENT DOCUMENTS

| 2006/0102918 A1* | 5/2006 | Su et al. ........................... 257/99 |
| 2009/0283792 A1* | 11/2009 | Kim et al. ........................ 257/99 |
| 2010/0193821 A1* | 8/2010 | Fukasawa et al. ............... 257/98 |
| 2011/0198655 A1* | 8/2011 | De Graaf et al. ............... 257/98 |

* cited by examiner

*Primary Examiner* — Kyoung Lee
*Assistant Examiner* — Ratisha Mehta
(74) *Attorney, Agent, or Firm* — Altis & Wispro Law Group, Inc.

(57) ABSTRACT

An LED (light emitting diode) includes a base, a pair of leads fixed on the base, a housing secured on the leads, a chip mounted on one lead and an encapsulant sealing the chip. The housing defines a cavity to receive the chip. The cavity includes an upper chamber and a lower chamber communicating with the upper chamber. The lower chamber is gradually expanded along a top-to-bottom direction of the LED, and the upper chamber is gradually expanded along a bottom-to-top direction of the LED. The encapsulant substantially fills the lower chamber and the upper chamber.

10 Claims, 10 Drawing Sheets

LED AND METHOD FOR MANUFACTURING THE SAME

CROSS-REFERENCE TO RELATED APPLICATION

This patent application is related to U.S. patent application Ser. No. 13/330,688, entitled "LED AND METHOD FOR MANUFACTURING THE SAME", assigned to the same assignee, and disclosure of which is incorporated herein by reference in its entirety.

BACKGROUND

1. Technical Field

The present disclosure relates to LEDs (light emitting diodes) and methods for manufacturing the LEDs, and more particularly, to an LED having a good waterproof capability and a method for manufacturing the LED.

2. Description of Related Art

As a new type of light source, LEDs are widely used in various applications. A typical LED includes a base, a pair of metal leads fixed on the base, a housing formed on the leads, a light emitting chip fixed on the leads and electrically connected to the leads via wires, and an encapsulant attached on the housing and sealing the light emitting chip. The housing is often formed by molding a material of PPA (polyphthalamide) on the two metal leads. However, the attachment between the housing and the leads is unreliable due to poor adherent capability of PPA to metal. Therefore, moisture of the outside environment may enter the LED through an interface between the leads and the housing, causing malfunction of the light emitting chip.

What is needed, therefore, is an LED and a method for manufacturing the LED which can overcome the limitations described above.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
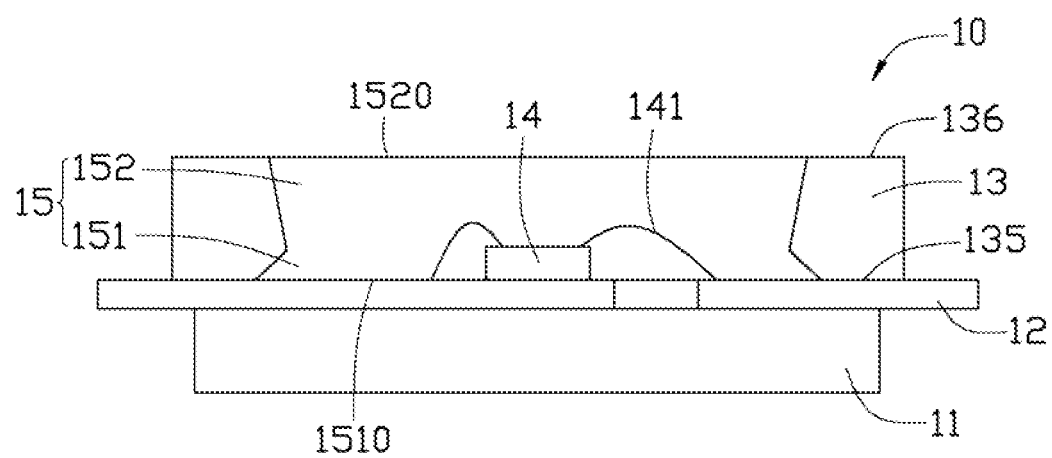
FIG. 1 shows an LED in accordance with a first embodiment of the present disclosure.

Referring to FIG. 1, an LED (light emitting diode) 10 in accordance with a first embodiment of the present disclosure is shown. The LED 10 includes a base 11, a pair of leads 12 fixed on the base 11, a housing 13 secured on the leads 12, a light emitting chip 14 received in the housing 13 and electrically connected to the pair of leads 12 and an encapsulant 15 filled in the housing 13 and sealing the chip 14.

The base 11 may be made of plastic such as PPA (polyphthalamide). The base 11 may have a rectangular shape. The leads 12 are made of metal such as copper or aluminum. The leads 12 are fixed on a top face of the base 11. The two leads 12 are spaced from each other. Each lead 12 protrudes horizontally outside of the base 11 for in electrical connection with an external circuit (not shown), thereby receiving a driving power for the chip 14 from an external power source (not shown). The base 11 may be formed on the two leads 12 via injection-molding, transfer-molding or other suitable methods.

The housing 13 may be formed on the leads 12 by injection-molding, transfer-molding or other suitable methods. The housing 13 may also be made of PPA. An outer periphery of the housing 13 is larger than that of the base 11 so that a distance between an outer periphery of the housing 13 and free ends of the leads 12 is smaller than that between an outer periphery of the base 11 and the free ends of the leads 12. The leads 12 also protrude horizontally outside the outer periphery of the housing 13. Also referring to FIG. 6, the housing 13 defines a cavity 131 extending from a bottom face 135 to a top face 136 thereof to expose top faces 126 of the leads 12. The cavity 131 includes an upper chamber 1312 and a lower chamber 1311 communicating with the upper chamber 1312. The upper chamber 1312 has a truncated taper shape with an inner diameter gradually decreasing along a top-to-bottom direction of the LED 10. The lower chamber 1311 has an inner diameter gradually increasing along the top-to-bottom direction of the LED 10. The upper chamber 1312 has a volume and height larger than that of the lower chamber 1311. An inner diameter of the cavity 131 at the bottom face 135 is larger than that at the top face 136. An angle α is defined between an upper portion of an inner circumferential face of the housing 13 defining the upper chamber 1312 and the top face 136 of the housing 13. An angle β is defined between a lower portion of an inner circumferential face of the housing 13 defining the lower chamber 1311 and the bottom face 135 of the housing 13. The angle α and the angle β are both obtuse angles, and located outside of the cavity 131. The angle α is less than the angle β.

The chip 14 may be fixed on one of the two leads 12 by silver epoxy gluing, eutectic bonding or other methods. The chip 14 may be a GaN chip, an InGaN chip, an AlInGaN chip or other light emitting semiconductor chips. The chip 14 is electrically connected to the two leads 12 via two bonding wires 141. The encapsulant 15 is filled in the cavity 131 to seal the chip 14 and the wires 141. The encapsulant 15 may be made of epoxy, silicon or other transparent materials. The encapsulant 15 includes an upper portion 152 filling the upper chamber 1312 and a lower portion 151 filling the lower chamber 1311. The upper portion 152 has an outer diameter gradually decreasing along the top-to-bottom direction of the LED 10, and the lower portion 151 has an outer diameter gradually increasing along the top-to-bottom direction of the LED 10.

The upper portion 152 has a top face 1520 flush with the top face 136 of the housing 13, and the bottom portion 151 has a bottom face 1510 flush with the bottom face 135 of the housing 13. An area of the bottom face 1510 of the encapsulant 15 is larger than that of the housing 13. Fluorescent material such as YAG (yttrium aluminum garnet), TAB (terbium aluminum garnet), phosphide or sulfide can be uniformly distributed in the encapsulant 15 to covert the color of light from the chip 14 to a desired color.

The encapsulant 15 made of epoxy or silicon has a larger bonding force with the metal leads 12 than that of the housing 13 made of PPA with the metal leads 12. Therefore, as increasing of contact areas between the encapsulant 15 and the leads 12, and corresponding decreasing of contact areas between the housing 13 and the leads 12, the encapsulant 15 can be adhered to the leads 12 more tightly and reliably. The encapsulant 15 thus prevents outside moisture from entering the LED 10 and damaging the chip 14.

A method for manufacturing the LED 10 is also disclosed. The method mainly includes a series of steps as follows.

Figure 2:
FIG. 2 shows a first process of manufacturing the LED of FIG. 1.
Figure 3:
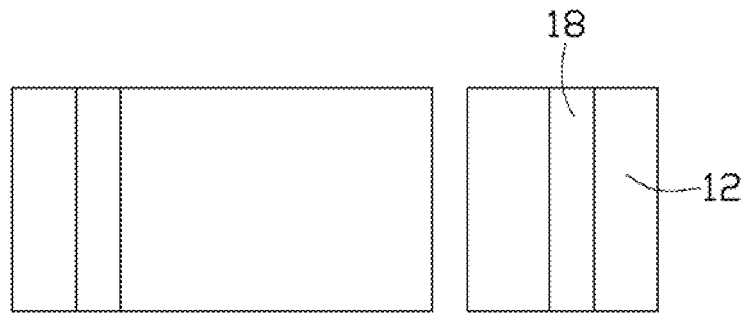
FIG. 3 is a top view of a semi-finished product obtained from the first process of manufacturing the LED of FIG. 2.
Figure 4:
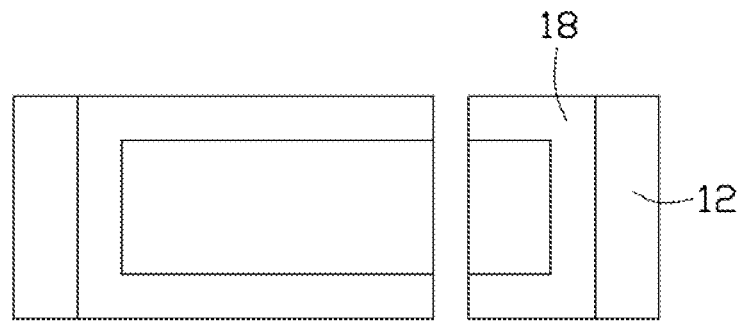
FIG. 4 is similar to FIG. 3, but showing a semi-finished product of an LED in accordance with a second embodiment of the present disclosure.

First, a pair of leads 12 is provided as shown in FIGS. 2-3. The two leads 12 have two blocking protuberance 18 formed on top faces 126 thereof, respectively. The two blocking protuberances 18 may be made of photoresist. The photoresist can be designed to have required shape via photolithograph technology. In this embodiment, each blocking protuberance 18 has a strip-like shape with a triangle cross section. Each blocking protuberance 18 extends from a side to an opposite lateral side of a corresponding lead 12 (see FIG. 3), crossing an extending direction of the corresponding lead 12. The two blocking protuberances 18 are located adjacent to and spaced from two opposite outer free ends of the two leads 12, respectively. Alternatively, as shown in FIG. 4, each blocking protuberance 18 may also have a shape of a U-shaped configuration with two feet extending to a corresponding one of two facing inner ends of the leads 12. The U-shaped structure of the blocking protuberance 18 can reinforce the moisture-proof function of the LED 10 to make the LED 10 be hermetical not only to two lateral sides thereof but also to front and rear sides thereof.

Figure 5:
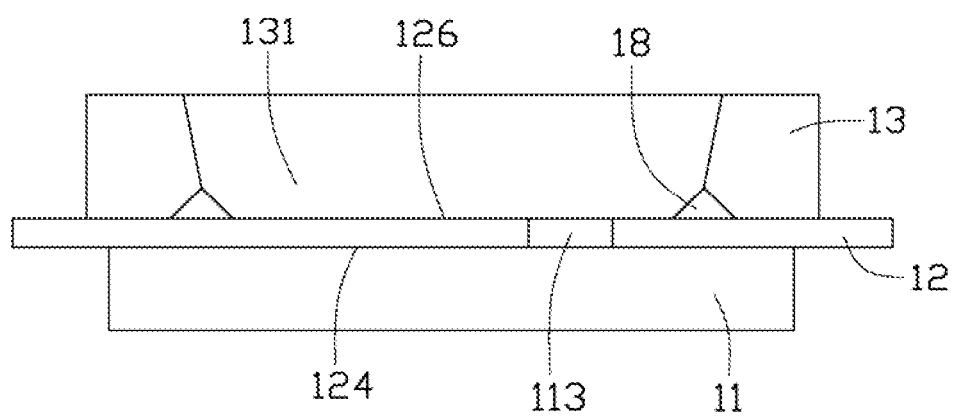
FIG. 5 shows a second process of manufacturing the LED of FIG. 1.

A base 11 and a housing 13 are then formed on the leads 12 by molding as shown in FIG. 5. The base 11 and the housing 13 may be separately or integrally formed, depending on the actual requirements. The base 11 is attached on bottom faces 124 of the leads 12, and the housing 13 is attached on the top faces 126 of the leads 12. A gap 113 between the leads 12 may be filled by the base 11 during molding, or kept empty, also depending on the actual requirements. The housing 13 defines a cavity 131 in a central area thereof. The top faces 126 of the leads 12 are exposed in the cavity 131. The housing 13 covers a part of each blocking protuberance 18, remaining the other part of each blocking protuberance 18 exposed within the cavity 131.

Figure 6:
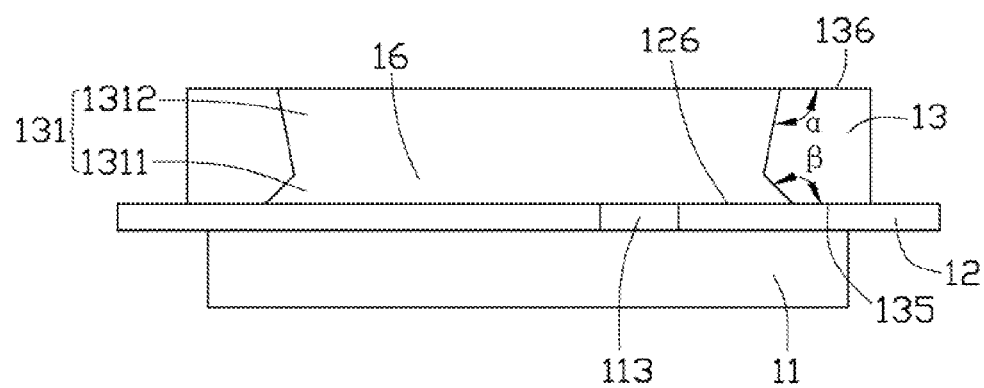
FIG. 6 shows a third process of manufacturing the LED of FIG. 1.

The blocking protuberances 18 are removed by dipping the blocking protuberances 18 into a chemical solution where the blocking protuberances 18 are dissolved. A lower portion 16 of the cavity 131 is expanded laterally to form a wider lower chamber 1311 as shown in FIG. 6.

Figure 7:
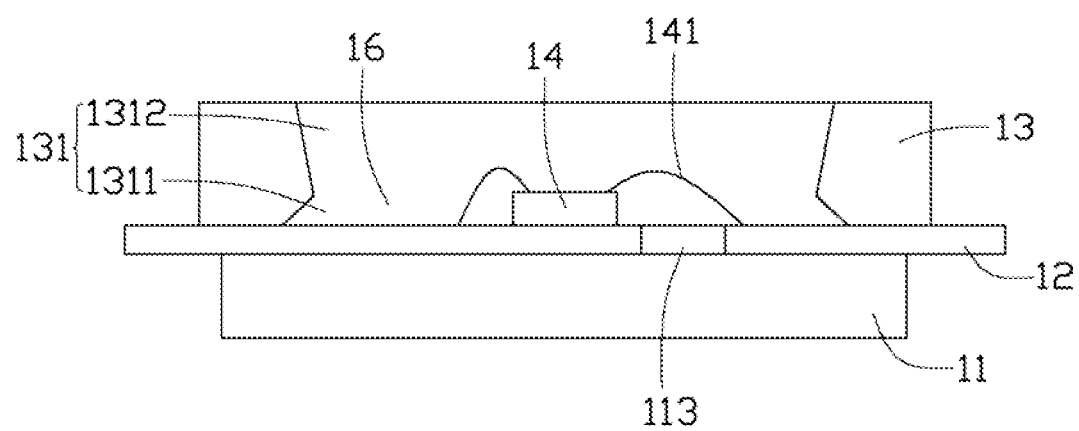
FIG. 7 shows a fourth process of manufacturing the LED of FIG. 1.

As shown in FIG. 7, a chip 14 is fixed on one of the leads 12 and electrically connected to the leads 12 through a wire bonding of two wires 141.

Finally, an encapsulant 15 is filled into the cavity 131 to seal the chip 14 in the cavity 131 as shown in FIG. 1.

Figure 8:
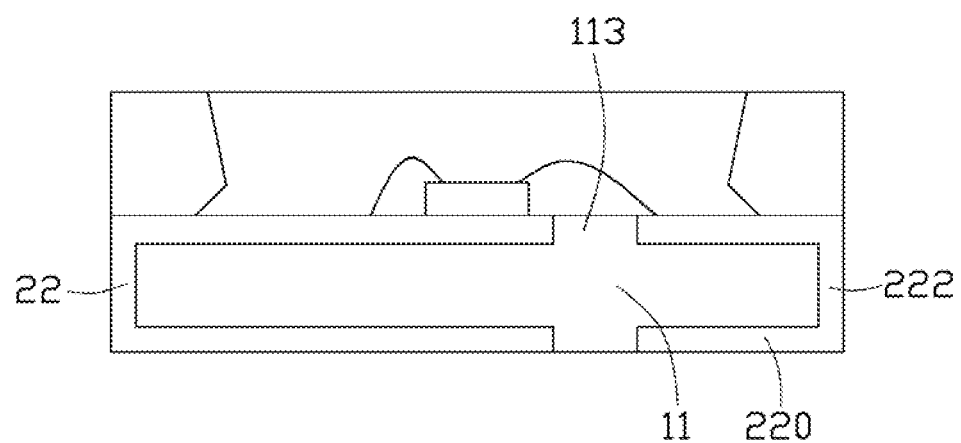
FIG. 8 shows an LED in accordance with a third embodiment of the present disclosure.
Figure 9:
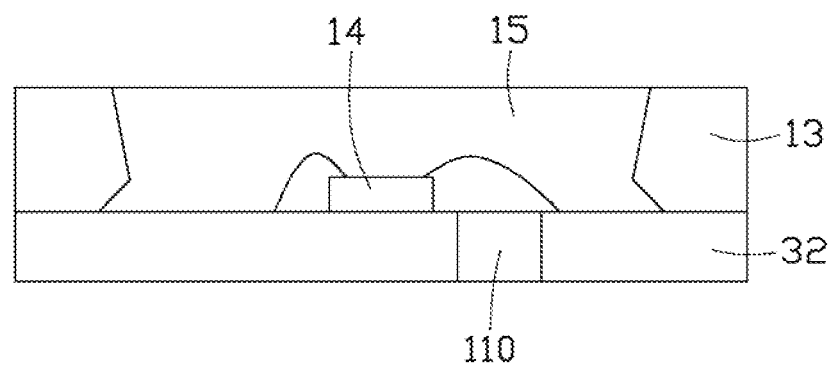
FIG. 9 shows an LED in accordance with a fourth embodiment of the present disclosure.
Figure 10:
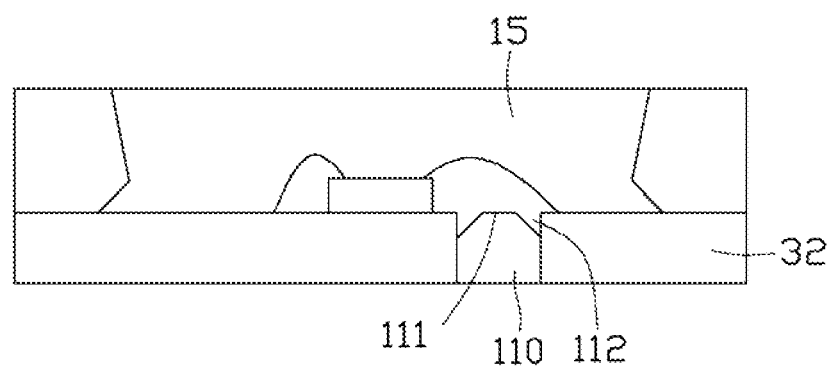
FIG. 10 shows an LED in accordance with a fifth embodiment of the present disclosure.

Furthermore, the leads 12 of the two embodiments may be varied to have different structures. For example, as shown in FIG. 8, the leads 22 each may include two horizontal sections 220 and a vertical section 222 interconnecting the two parallel sections 220. In addition, as shown in FIG. 9, if the two leads 32 are thick enough to provide sufficient strength, most parts of the base 11 may be omitted and only a block 110 is retained in the gap 113 between the two leads 12. The block 110 is used for increasing the strength of the two leads 22. Alternatively, a top face 111 of the block 110 may also defines two grooves 112 in two opposite sides thereof as shown in FIG. 10. The two grooves 112 are symmetrical with respect to each other. The encapsulant 15 may fill the grooves 112 during molding for further preventing the outside moisture from entering the LED 10 from interfaces between the block 110 and the leads 12.

It is believed that the present disclosure and its advantages will be understood from the foregoing description, and it will be apparent that various changes may be made thereto without departing from the spirit and scope of the present disclosure or sacrificing all of its material advantages, the examples hereinbefore described merely being preferred or exemplary embodiments.

What is claimed is:

1. An LED (light emitting diode) comprising:
a pair of leads spaced from each other;
a chip electrically connected to the leads;
a housing fixed on the leads, the housing defining a cavity to receive the chip; and
an encapsulant filling the cavity to seal the chip;
wherein the encapsulant comprises an upper portion and a lower portion, the lower portion having a bottom face joining the leads and a top face connected to the upper portion;
wherein the lower portion of the encapsulant is expanded from the top face towards the bottom face thereof;
wherein a block is formed between the two leads to interconnect the two leads; and
wherein the block defines two grooves in interfaces between the block and the two leads, respectively, the two grooves being located at a top face of the block and filled with the encapsulant.

2. The LED of claim 1, wherein the lower portion of the encapsulant is gradually expanded from the top face towards the bottom face thereof.

3. The LED of claim 1, wherein the upper portion of the encapsulant is gradually expanded along a bottom-to-top direction from the top face of the lower portion toward a top face of the upper portion.

4. The LED of claim 1, wherein an angle between an inner circumference surface of a lower portion of the housing and a bottom face of the housing is larger than an angle between an inner circumference surface of an upper portion of the housing and a top face of the housing.

5. The LED of claim 4, wherein an inner diameter of the top face of the housing is less than an inner diameter of the bottom face of the housing.

6. The LED of claim 1, wherein the lower portion of the encapsulant has a volume less than that of the upper portion of the encapsulant.

7. The LED of claim 1, wherein an area of the bottom face of the lower portion of the encapsulant is larger than an area of a bottom face of the housing joining the leads.

8. The LED of claim 1 further comprising a base fixed to the two leads, wherein the base is attached to bottom faces of the two leads, and the housing is attached to top faces of the two leads.

9. The LED of claim 8, wherein the housing has an outer periphery larger than that of the base.

10. The LED of claim 1, wherein the housing and the base are made of the same material.

* * * * *